US008320125B1

(12) United States Patent
Hamburgen et al.

(10) Patent No.: US 8,320,125 B1
(45) Date of Patent: Nov. 27, 2012

(54) MODULAR DATA CENTER COOLING

(75) Inventors: William Hamburgen, Palo Alto, CA (US); Jimmy Clidaras, Los Altos, CA (US); Winnie Leung, Palo Alto, CA (US); David W. Stiver, Santa Clara, CA (US); Jonathan D. Beck, Mountain View, CA (US); Andrew B. Carlson, Atherton, CA (US); Steven T. Y. Chow, Foster City, CA (US); Gregory P. Imwalle, Sunnyvale, CA (US); Amir M. Michael, San Mateo, CA (US)

(73) Assignee: Exaflop LLC, Mountain View, CA (US)

( * ) Notice: Subject to any disclaimer, the term of this patent is extended or adjusted under 35 U.S.C. 154(b) by 0 days.

(21) Appl. No.: 12/631,644

(22) Filed: Dec. 4, 2009

Related U.S. Application Data

(63) Continuation of application No. 11/774,257, filed on Jul. 6, 2007, now abandoned.

(60) Provisional application No. 60/947,361, filed on Jun. 29, 2007.

(51) Int. Cl.
*H05K 7/20* (2006.01)

(52) U.S. Cl. ........ 361/695; 361/689; 361/698; 361/699; 361/700; 361/679.48; 361/679.53; 165/80.4; 165/104.33; 165/185; 62/175; 62/259.2; 62/305

(58) Field of Classification Search ....... 361/679.46–53, 361/688, 689, 690–696, 698, 702, 717–724, 361/729, 730, 732, 831; 165/80.2, 80.3, 165/80.4, 80.5, 104.22, 104.33, 104.34, 121–127, 165/185; 312/223.2, 223.3, 236; 62/3.3, 62/259.2, 135, 137, 259.1, 440, 441, 267; 454/137, 184

See application file for complete search history.

(56) References Cited

U.S. PATENT DOCUMENTS

| 3,885,296 | A |   | 5/1975  | Stout             |         |
|-----------|---|---|---------|-------------------|---------|
| 4,429,734 | A | * | 2/1984  | Vandervaart       | 165/240 |
| RE33,220  | E |   | 5/1990  | Collier           |         |
| 5,036,677 | A |   | 8/1991  | Neuenfeldt et al. |         |
| 5,052,157 | A |   | 10/1991 | Ducroux et al.    |         |
| 5,053,637 | A |   | 10/1991 | Dillard           |         |
| 5,477,649 | A |   | 12/1995 | Bessert           |         |
| RE35,369  | E |   | 11/1996 | Ducroux et al.    |         |
| 5,671,805 | A |   | 9/1997  | Ståhl et al.      |         |
| 5,707,007 | A |   | 1/1998  | Fiedrich          |         |

(Continued)

OTHER PUBLICATIONS

Luiz Andre Barroso et al., "Web Search for a Planet: The Google Cluster Architecture", Mar./Apr. 2003, IEEE Micro, 23(2), pp. 22-28.

(Continued)

*Primary Examiner* — Michail V Datskovskiy
(74) *Attorney, Agent, or Firm* — Fish & Richardson P.C.

(57) ABSTRACT

A datacenter cooling apparatus includes a portable housing having lifting and transporting structures for moving the apparatus, opposed sides in the housing, at least one of the opposed sides defining one or more air passage openings arranged to capture warmed air from rack-mounted electronics, opposed ends in the housing, at least one of the opposed ends defining one or more air passage openings positioned to allow lateral passage of captured air into and out of the housing, and one or more cooling coils associated with the housing to receive and cool the captured warm air, and provide the cooled air for circulation into a datacenter workspace.

60 Claims, 10 Drawing Sheets

U.S. PATENT DOCUMENTS

| | | | |
|---|---|---|---|
| 5,709,100 | A | 1/1998 | Baer et al. |
| 5,718,628 | A | 2/1998 | Nakazato et al. |
| 6,061,982 | A | 5/2000 | Owen |
| 6,061,984 | A | 5/2000 | Rose |
| 6,167,714 | B1 | 1/2001 | Baffes |
| 6,305,180 | B1 | 10/2001 | Miller et al. |
| 6,327,143 | B1 | 12/2001 | Bonstrom et al. |
| 6,374,627 | B1 | 4/2002 | Schumacher et al. |
| 6,405,549 | B1 | 6/2002 | Baffes |
| 6,494,050 | B2 | 12/2002 | Spinazzola et al. |
| 6,775,137 | B2 | 8/2004 | Chu et al. |
| 6,786,056 | B2 | 9/2004 | Bash et al. |
| 6,854,287 | B2 | 2/2005 | Patel et al. |
| 6,918,217 | B2 | 7/2005 | Jakob et al. |
| 6,924,981 | B2 | 8/2005 | Chu et al. |
| 7,114,555 | B2 | 10/2006 | Patel et al. |
| 7,145,772 | B2 | 12/2006 | Fink |
| 7,173,820 | B2 | 2/2007 | Fink et al. |
| 7,183,504 | B2 | 2/2007 | Byrne |
| 7,259,963 | B2 | 8/2007 | Germagian et al. |
| 7,278,273 | B1 | 10/2007 | Whitted et al. |
| 7,319,594 | B2 | 1/2008 | Nicolai et al. |
| 7,325,410 | B1 | 2/2008 | Bean |
| 7,365,973 | B2 | 4/2008 | Rasmussen et al. |
| 7,370,489 | B2 * | 5/2008 | Rios et al. ............... 62/285 |
| 7,430,118 | B1 | 9/2008 | Noteboom et al. |
| 7,447,022 | B2 | 11/2008 | Murakami et al. |
| 7,462,785 | B1 | 12/2008 | Davis et al. |
| 7,476,801 | B1 | 1/2009 | Davis et al. |
| 7,477,514 | B2 | 1/2009 | Campbell et al. |
| 7,511,960 | B2 | 3/2009 | Hillis et al. |
| 7,542,285 | B2 | 6/2009 | Colucci et al. |
| 7,630,795 | B2 | 12/2009 | Campbell et al. |
| 7,647,787 | B2 | 1/2010 | Belady et al. |
| 7,660,121 | B2 | 2/2010 | Campbell et al. |
| 7,669,641 | B2 * | 3/2010 | Rembold et al. ............... 165/53 |
| 7,724,518 | B1 | 5/2010 | Carlson et al. |
| 7,810,341 | B2 | 10/2010 | Belady |
| 2005/0235671 | A1 | 10/2005 | Belady et al. |
| 2006/0065000 | A1 | 3/2006 | Belady |
| 2007/0025271 | A1 | 2/2007 | Niedrich et al. |
| 2007/0227710 | A1 | 10/2007 | Belady et al. |
| 2007/0259616 | A1 | 11/2007 | Scattolin et al. |
| 2008/0055846 | A1 | 3/2008 | Clidaras et al. |
| 2009/0031148 | A1 | 1/2009 | Densham |
| 2009/0100848 | A1 | 4/2009 | Kuriyama et al. |
| 2009/0122487 | A1 | 5/2009 | Campbell et al. |
| 2009/0122488 | A1 | 5/2009 | Iyengar et al. |
| 2009/0150123 | A1 | 6/2009 | Archibald et al. |
| 2009/0150129 | A1 | 6/2009 | Archibald et al. |
| 2009/0156114 | A1 | 6/2009 | Ahladas et al. |
| 2009/0241578 | A1 | 10/2009 | Carlson et al. |

OTHER PUBLICATIONS

Mark Early, P.E. et al., "645.5 Supply Circuits and Interconnecting Cables", 2005 Ed., National Electrical Code Handbook, National Fire Protection Association, pp. 956-957.

Taliver Heath et al., "Mercury and Freon: Temperature Emulation and Management for Server Systems", Oct. 21-25, 2006, In International Conference on Architectural Support for Programming Languages and Operating Systems (ASPLOS '06), pp. 106-116.

* cited by examiner

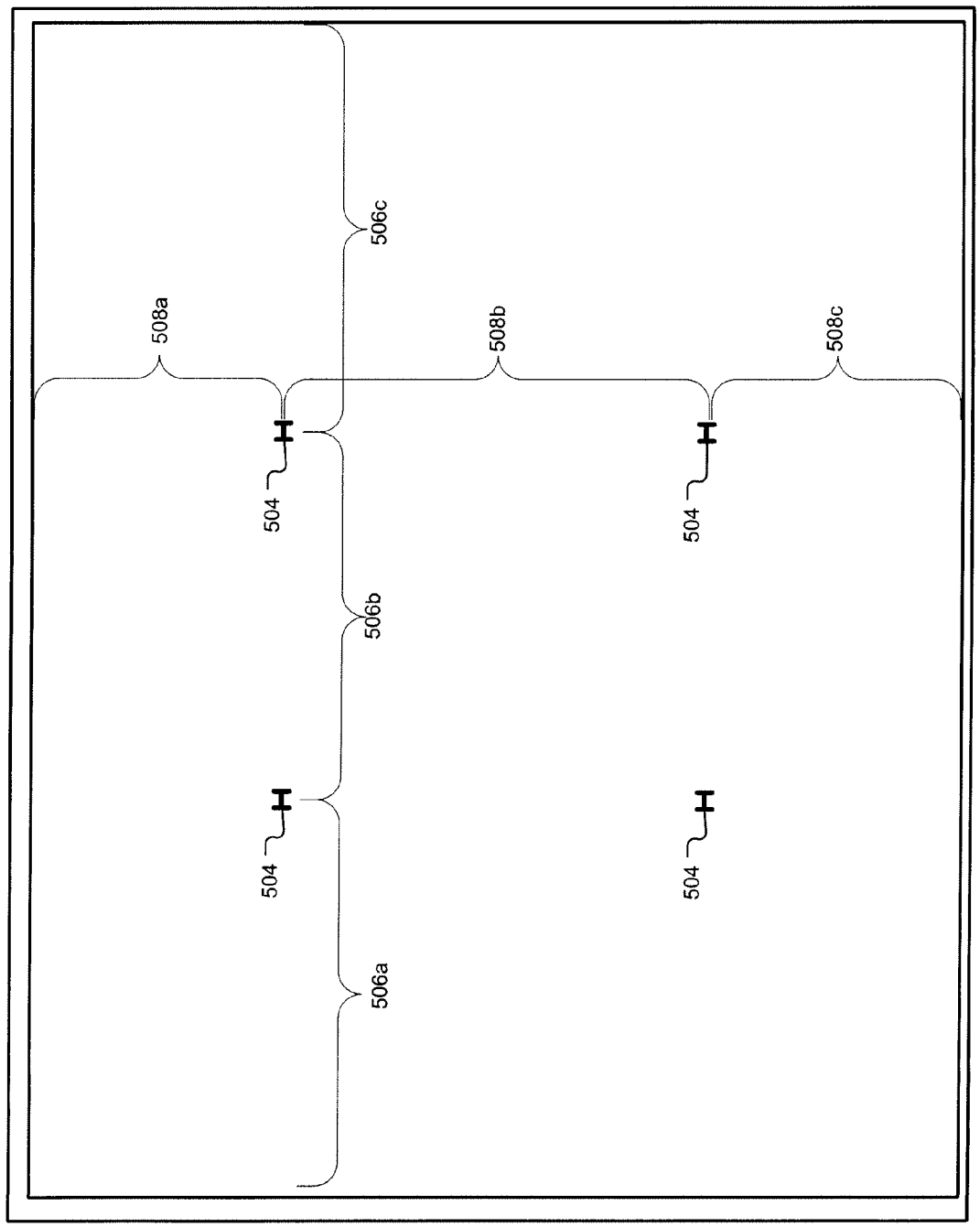

MODULAR DATA CENTER COOLING

CROSS-REFERENCE TO RELATED APPLICATIONS

This application is a continuation of U.S. application Ser. No. 11/774,257, filed on Jul. 6, 2007, which claims priority to U.S. Application Ser. No. 60/947,361, filed on Jun. 29, 2007, the contents of which are hereby incorporated by reference in their entirety.

TECHNICAL FIELD

This document discusses techniques for providing ventilation and cooling to facilities hosting electronic equipment, such as computer data centers.

BACKGROUND

When discussing the "power" of computers, people typically focus on speed—so-called processing power. The electrical power consumed by the computers gets less attention. But to people who operator computer data centers—facilities that contain hundreds or thousands (or tens of thousands) of computers serving requests from remote users—the electrical power can be every bit as important as the processing power. Each computer can consume several hundreds watts—the same as several floodlights. Multiplying that total across thousands of computers should make plain that the potential consumption level can be fairly high.

The operating computers convert all of that consumed electricity into heat. And that heat has to be removed. So operating a data center is like an electrical double whammy—you have to pay once to use the electricity, and you have to pay again to remove the effects of the use of the electricity (which itself requires more electricity). The effects of power consumed by the critical load in the data center are thus compounded when one incorporates all of the ancillary equipment required to support the critical load, such as pumps, chillers, and other such components.

SUMMARY

This document describes systems and methods that may be employed to provide cooling for facilities hosting electronic equipment. The techniques described here may, in certain implementations, provide data center operators with flexibility in layout, and may provide for high volume heat removal using relatively simple and inexpensive equipment. In addition, in certain implementations, much of the equipment may be pre-fabricated and tested at a factory, and then quickly installed and commissioned on-site, so as to provide for faster "go live" time for a facility, and to allow for less expensive, but more dependable, equipment construction.

In general, as described below, modular units may be provided to capture warm air that exits rack servers or other such devices to prevent the warm air from escaping and mixing with the ambient air in a data center. The modular units may then cool the captured warm air and provide the cooled air back into the ambient space, where it can be circulated through the rack servers or other equipment again. The modular units may be configured so that captured air may pass between the units, so that if one unit is not working well or is otherwise overloaded, air from it may pass to other units. Also, space may be provided between units that are aligned in a row in certain implementations, and warmed air may be captured in the space and then drawn into adjacent units. In this manner, for example, cooling capacity may be matched better to heat generated by the cooling load (the electronic equipment), particularly if the load varies from rack to rack or if the load changes over time.

In addition, the units may be spaced, in X and Y directions, so that structural columns in a facility (or other interruptions in a floor plate) are all or mostly located in the empty warm air plenum created in a row of cooling units, in the spaces between cooling units. In this manner, the columns can effectively disappear in the data center space.

In one implementation, a datacenter cooling apparatus is disclosed. The apparatus includes a portable housing having lifting and transporting structures for moving the apparatus, opposed sides in the housing, at least one of the opposed sides defining one or more air passage openings configured to capture warmed air from rack-mounted electronics, opposed ends in the housing, at least one of the opposed ends defining one or more air passage openings positioned to allow lateral passage of captured air into and out of the housing, and one or more cooling coils associated with the housing to receive and cool the captured warm air, and provide the cooled air for circulation into a datacenter workspace. The opposed sides can each define openings to engage with back-to-back computer racks. The apparatus can also include computer racks on opposed sides of the apparatus, and positioned to provide warm air to the apparatus. In addition, the apparatus can include a space inside the housing between the opposed faces in the warm-air plenum whereby warm air may pass from one of the one computer rack to an opposed computer rack.

In certain aspects, the apparatus can comprise skid mounts on the housing to permit movement of the apparatus using a mechanical lift. The housing can define a width along the ends and a length along the sides that is greater than the width, and wherein the length is between about six feet and about eight feet. In addition, one or more fans mounted on the apparatus can be provided and can be positioned to circulate air from the electronics through the cooling coils and into the datacenter workspace. The one or more fans can be located near a top edge of the housing and can be positioned to blow air vertically upward. The coil can itself be mounted horizontally below the fans. In addition, the coil can be rotatable into a vertical orientation for servicing. Moreover, the one or more fans can be located on replaceable mounts with associated fan controllers.

In certain aspects, the one or more cooling coils are arranged in a V formation and form a cool-air plenum that is separate from the warm air capture plenum. The apparatus can also comprise a wiring rack supported by the housing for holding networking cable in a position to be interfaced with the rack-mounted computers. In addition, the apparatus can include anchors on the housing having attachment points for computer racks to provide seismic support for the racks. Furthermore, the apparatus may comprise a barrier near a periphery of the housing, the barrier having sealed openings for permitting passage of cooling water piping to the cooling coils. The openings can be in a floor of the apparatus and define an opening longitudinal axis that forms a substantial angle with an apparatus longitudinal access so as to permit positioning of piping along a diagonal of the apparatus. Moreover, the apparatus can include rollers located near a bottom portion of the apparatus configured to engage tracks for permitting lateral movement of the apparatus.

In another implementation, a data center cooling system is disclosed that includes a plurality of apparatuses just discussed. The apparatuses in the system can be positioned in one or more end-to-end substantially linear arrangements, and computer racks are located on opposed sides of the apparatuses. Also, the plurality of apparatuses can define an apparatus pitch and the computer racks define one or more rack pitches, and wherein the apparatus pitch differs substantially from the rack pitches. Two or more of the plurality of apparatuses can be separated by an end-to-end distance.

In yet another implementation, a data center cooling system is disclosed. The system comprises a plurality of cooling modules aligned end-to-end in one or more rows, sides on the cooling modules defining openings for capturing warm air from electronics racks mounted to the cooling modules, and ends on the cooling modules defining openings for passing air into and out of the cooling modules along a row of cooling modules, wherein the cooling modules in a row are positioned to have open spaces between adjacent cooling modules and wherein the spaces are sufficiently sealed form a data center workspace to form a warm air capture zone. The system may further comprise one or more cooling coils in each cooling module positioned between the warm air capture zone and a circulation fan suction zone. The cooling coil, for its part, can include a pair of opposed coils in a V formation, and the system may also include one or more fans associated with each cooling module for drawing warm air through the cooling coils.

In certain aspects, the system also includes electronic equipment racks in rows on opposed sides of the cooling unit rows to provide warm air to the cooling units. Also, the cooling units may define a cooling unit pitch and the electronic equipment racks may define one or more rack pitches, wherein the apparatus pitch differs substantially from the rack pitches. In addition, the warm air capture plenum can be contiguous along an entire row of the data center. Also, the cooling units in one or more rows can be unevenly spaced along the one or more rows. In addition, the system can include wiring racks supported by the cooling units for holding networking cable in a position to be interfaced with electronic equipment cooled by the system.

In other aspects, the system can also have a plurality of support structures extending upward from a data center floor and forming a plurality of rows of support structures, wherein each of the rows of cooling units envelops a row of support structures so that the support structures are out of a working area of the data center. The cooling units can comprise air cooling and circulation units having one or more air circulation fans and one or more cooling coils, and can define spaces between adjacent cooling units, and the support structures are located in the defined spaces. The system can also include a plurality of computer server racks defining substantially linear rows on opposed sides of each of the rows of cooling units.

In another implementation, a method of constructing a computer data center is disclosed, and comprises identifying a support grid comprised of a plurality of building supports in the computer data center, identifying a plurality of rows defined in the support grid, and positioning modular cooling units in a substantially linear arrangement along the plurality of rows defined in the support grid, with building supports located between the modular cooling units.

The details of one or more embodiments are set forth in the accompanying drawings and the description below. Other features, objects, and advantages will be apparent from the description and drawings, and from the claims.

DESCRIPTION OF DRAWINGS

FIG. 5A shows a plan of an empty computer data center facility.

Like reference symbols in the various drawings indicate like elements.

DETAILED DESCRIPTION

Figure 1A:
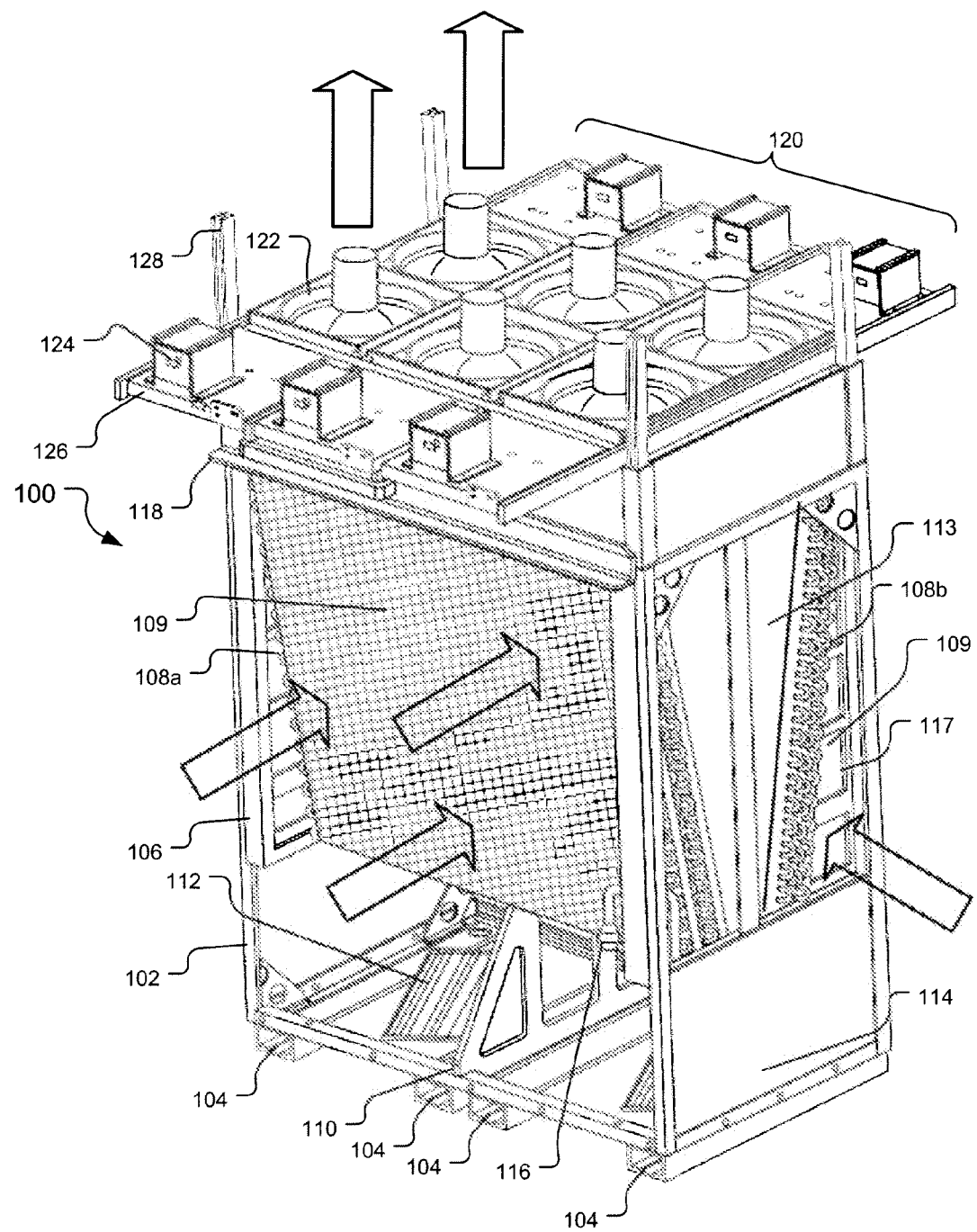
FIG. 1A shows a perspective view of a modular data center cooling apparatus.
Figure 1B:
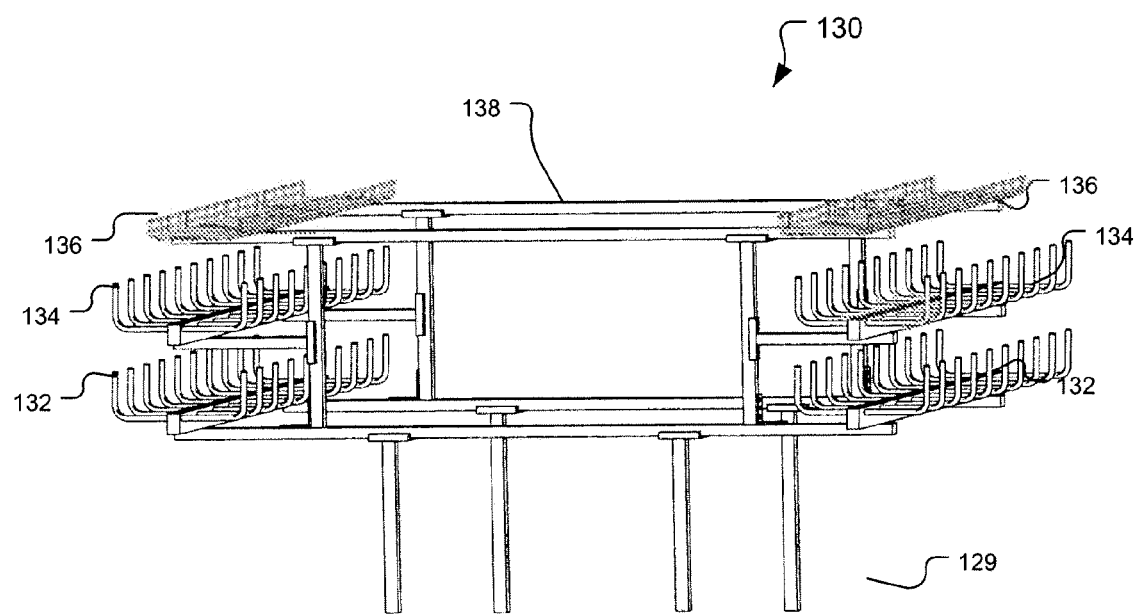
FIG. 1B shows a perspective view of a cable rack for use in a data center.
Figure 1C:
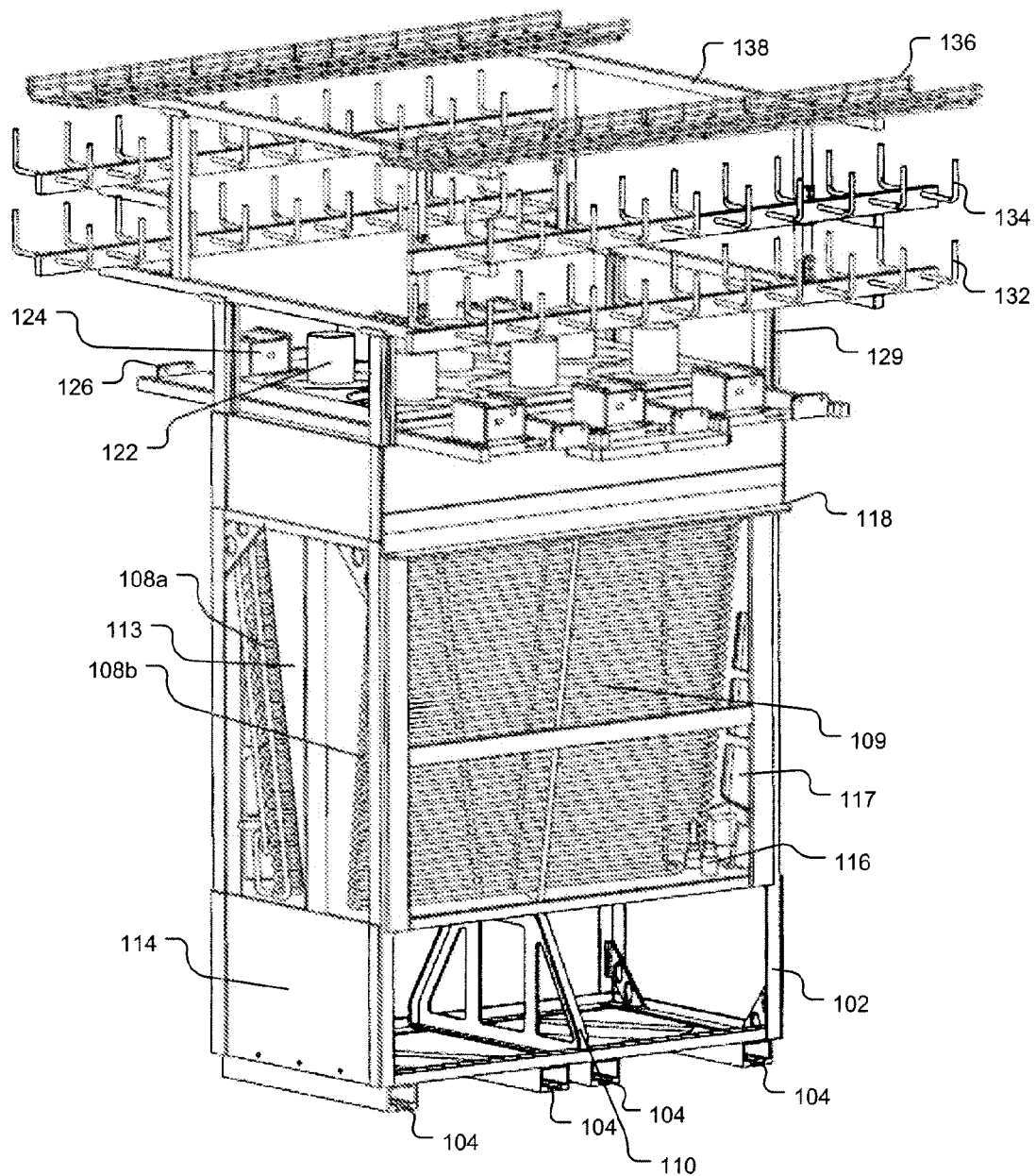
FIG. 1C shows the cable rack of FIG. 1B mounted to the top of the data center cooling apparatus of FIG. 1A.

FIG. 1A shows a perspective view of a modular data center cooling apparatus 100. FIG. 1B shows a perspective view of a cable rack 130 for use in a data center. FIG. 1C shows the cable rack of FIG. 1B mounted to the top of the data center cooling apparatus of FIG. 1A. In general, the apparatus 100 in the figures is an example of an apparatus that may be joined with computer racks in a data center to cool warmed air that passes over the computer racks, and to circulate the cooled air back into a workspace, where it may be drawn across the computer racks again.

To do so, the apparatus 100 may be located in a long row (e.g., 20 feet or more) of similar apparatuses that are sandwiched between rows of computer racks, such as in a relatively large data center. The back edges of the racks (i.e., the edges that are away from a workspace and are generally inaccessible) may contact the apparatus 100, and air may be drawn in the front of the computer racks (i.e., the side toward the workspace from which the racks are generally accessed), across various computing components such as processors and power supplies, and exhausted out the back of the racks to an opening in a side wall of the apparatus 100. The apparatus (or other apparatuses in the row) may then cool the air and re-circulate it back into the workspace.

As shown, the apparatus 100 generally has a rectangular-shaped housing 102 that supports a variety of cooling and air circulating components. The primary components in this example are cooling coils 108a, 108b, and a fan set 120. In a general installation, computer racks are arrayed in rows on opposed sides of the apparatus 100, i.e., creating a rack-apparatus-rack sandwich. The coils 108a, 108b define a warm air capture plenum 109 on one side of each coil, nearest the computer racks (not shown), and a cool air plenum (hidden in the figures) on their other side of the coils, which is in communication with the fans in the fans set 120.

The apparatus 100 pulls air through the opposed sets of racks where it is warmed, captures the warm air in the warm air capture plenum 109, draws the air through the coils 108a, 108b using the fan set 120, and exhausts the cooled air, which in this example, occurs in an upward direction. The removed air is then replaced by more air moving across computers in the computer racks (e.g., washing over the components on a motherboard), and the cool air is expelled into the workspace to replace air in the workspace that has been drawn into the computer racks. Thus, a fairly simple air circulation pattern may be established.

Figure 4:
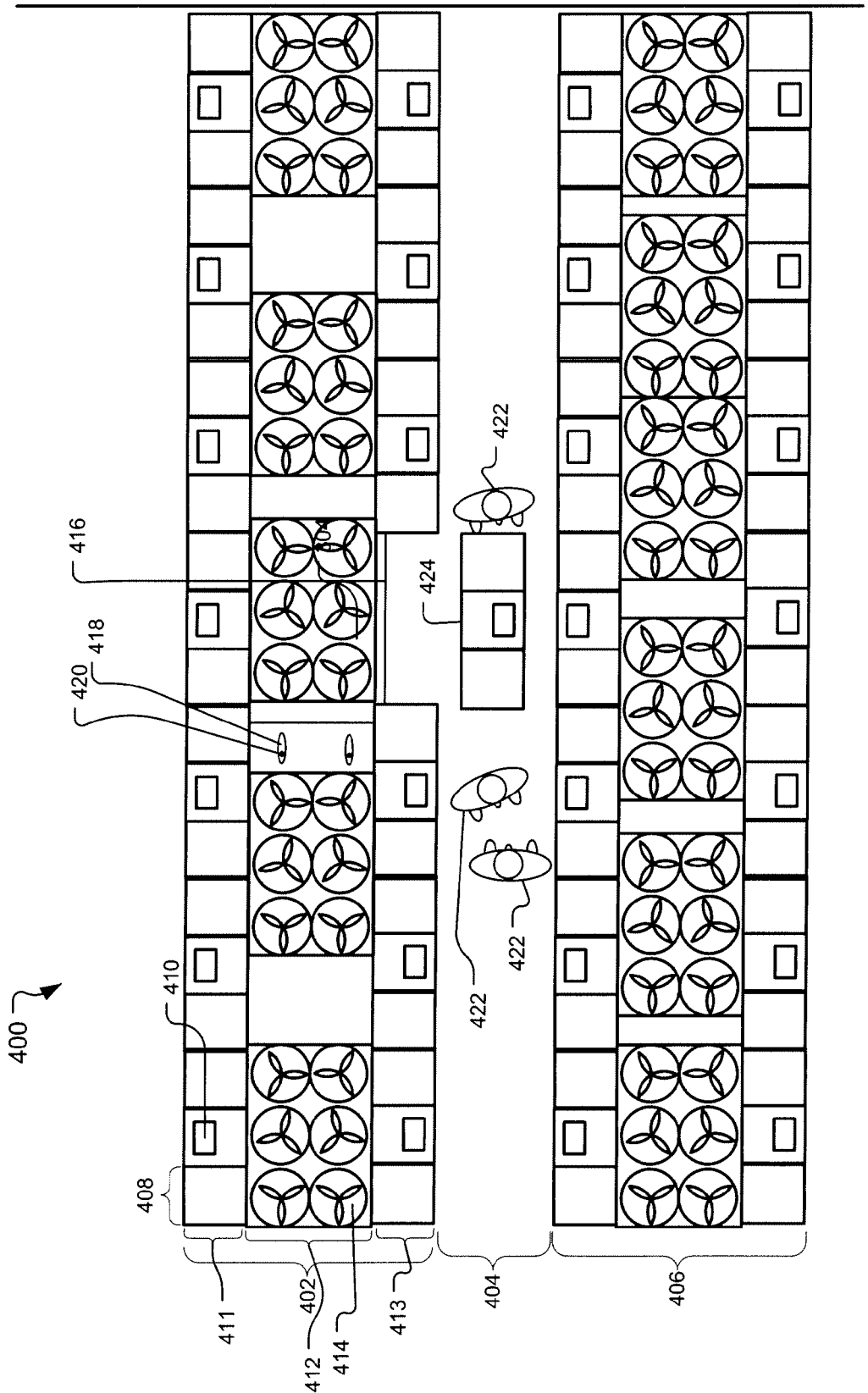
FIG. 4, shows a plan view of two rows in a computer data center.
Figure 6:
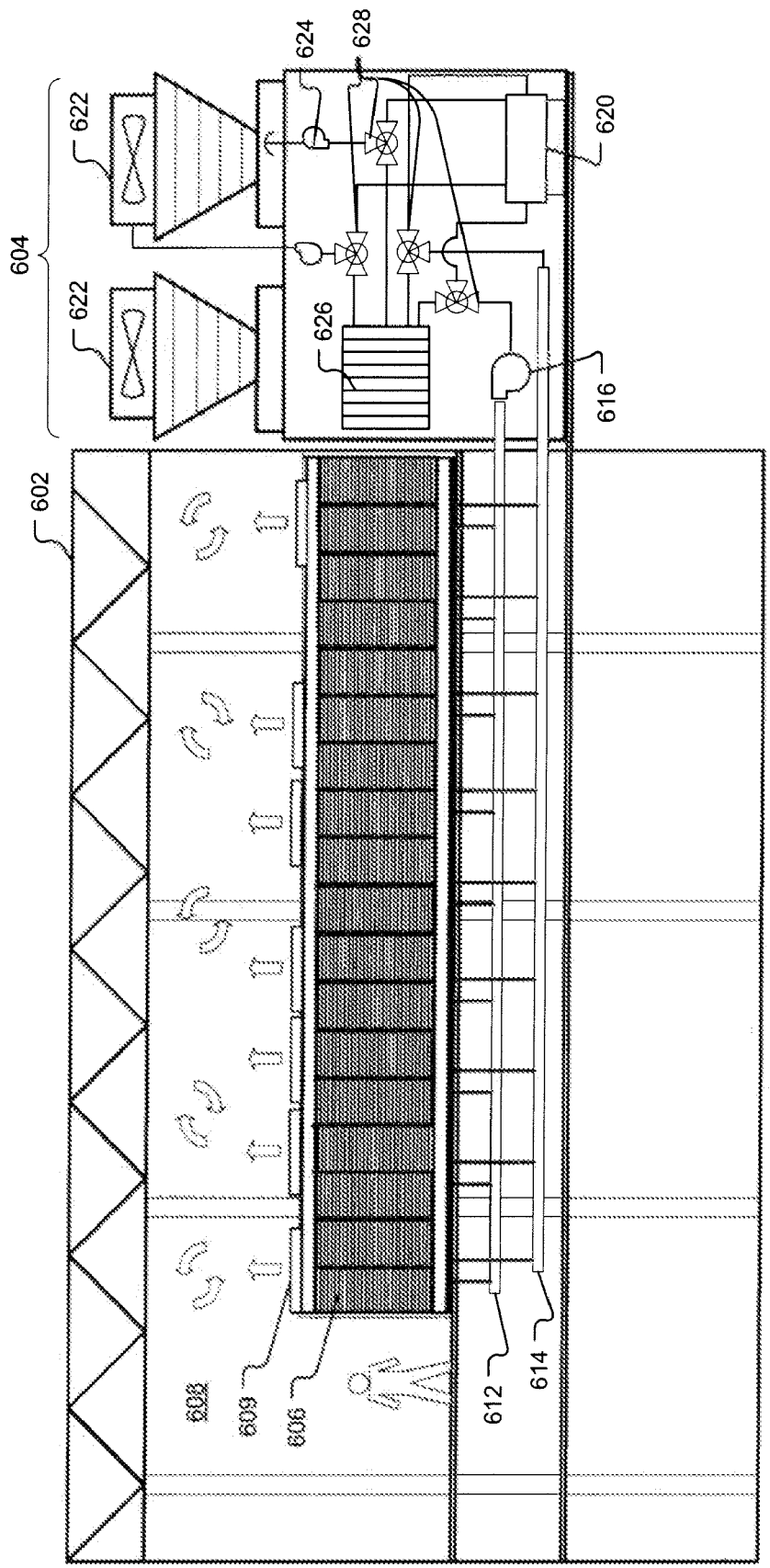
FIG. 6 shows a schematic side view of an example data center facility.

The area above the apparatus 100 is generally open to (or ducted to) a data center workspace's upper area when the apparatus 100 is installed, so that the fan set 120 blows air up into the upper area of the workspace (see FIGS. 4 and 6). In other implementations, air may be routed into a raised floor, into a space between computer racks, into a ceiling space, or may be routed in other manners also.

The components of housing 102 define a number of openings in the housing 102. For example, the side of the housing 102 toward which cooling coil 108a faces is substantially entirely open. As a result, air leaving the back edges of computer racks that are backed up to the apparatus 100 may readily flow into the warm air capture plenum 109 in front of cooling coil 108a. In a similar manner, air from racks on the opposed side of apparatus 100 may enter the warm air capture plenum 109 in front of cooling coil 108b.

In the example, the cooling coils 108a, 108b are arranged in a V-formation and sealed together at their bottom edges, and blanked off on their side edges. Such an arrangement acts to separate the warm air capture plenum 109 from the cool air plenum, and also positions the cooling coils 108a, 108b at an angle so that air flowing through the coils 108a, 108b begins moving in a direction upward toward fan set 120 after leaving the coils. A support 110 holds the coils 108a, 108b at their bottom midpoint to help prevent them from coming unattached, bending, or otherwise sagging. A frame 106 around the edges of the coils 108a, 108b provides additional rigidity to the coil assembly, and may be configured to be detached from the housing 102 so that the coils 108a, 108b may be conveniently removed if they require replacement.

As shown, a space exists beneath the coils 108a, 108b so that air in the warm air capture plenum 109 on one side of the apparatus 100 may flow to the other side of the apparatus 100. Such an arrangement may be beneficial, for example, to allow effective cooling of unbalanced loads, that is to say, when the volumetric flow of warmed air from the racks adjacent the coil 108a is much greater or less than the volumetric flow of warmed air from the racks adjacent coil 108b. This arrangement may also be beneficial if one of the coils becomes plugged or stops circulating cooling water. In such a situation, warm air from the less effective side of apparatus 100 may pass to the more effective side of apparatus 100 and be cooled there. As a result, such an arrangement may provide apparatus 100 with greater cooling flexibility, diversity, and redundancy. Other features providing additional flexibility, diversity, and redundancy to apparatus 100, whether used alone or as part of a system of multiple apparatuses, are described in more detail below.

Connector 116 may permit cooling water supply and return pipes or hoses to be connected to the cooling coils 108a, 108b. Connector 116 may take a variety of forms, such as a quick connect fitting, a screw-on fitting, or any other appropriate form of connection.

Access port 112 may be provided in a panel that forms a floor for the apparatus 100, or in a number of locations in the periphery of housing 102 where piping or other utilities need to enter housing 102. The access port 112 may be provided with brush seals or other forms of seals so that pressure differences between the warm air capture plenum 109 and the area below housing 102 do not cause substantial airflow into or out of the housing 102.

In the pictured implementation, the access port 112 is shown having its length at a substantial angle to the length of the apparatus 100, such as a 45 degree or 60 degree angle. Providing access port 112 at such an angle may aid in the provision of cooling piping or hoses to apparatus 100 when apparatus 100 is installed over a raised floor system. In particular, support beams immediately below the surface of the raised floor may need to be kept intact to provide adequate support for the raised floor tiles and the equipment that the tiles in turn support. The support beams generally run longitudinally with, or at a right angle to, equipment such as apparatus 100. If access port 112 was in line with such a support, and was located over such a support, piping might not be able to pass through the access port at any location without having to sever a beam. However, with the access port at an diagonal 112, an installer may generally move a pipe back and forth along the access port 112 until they find a location in which there is neither a longitudinal support member in the floor nor a lateral support member.

Where the apparatus 100 is to be mounted on a raised floor, it may also be dimensioned in its depth (i.e., its shorter dimension; here, from one side that meets with a rack to an opposed side) so as to be deeper than the space between support beams in the floor, so that it will not tend to break through the floor between support beams.

Various portions of the ends of apparatus 100, which in this example are at right angles to the sides of the apparatus 100 to which coils 108a, 108b face, may be left open or closed. In this example, panels 113 are provided at the ends of apparatus 100 between coils 108a, 108b—where the cool air plenum is. In this manner, cool air is prevented from flowing laterally out of apparatus 100, and is effectively held in the zone between the fans set 120, cooling coils 108a, 108b, and blanking panels at the ends of apparatus 100. This approach may simplify sealing during installation and may also simplify fan speed control after installation.

In contrast, passages may be provided for lateral movement of warm air approaching apparatus 100. For example, although blanking panel 114 may be installed on apparatus 100 initially to provide torsional rigidity during shipping, blanking panel 114 may be removed before or upon installation of apparatus 100. As a result, warm air that flows out of racks adjacent to apparatus 100 may flow into the side of apparatus 100, and then up through cooling coils 108a, 108b. In addition, pass through 117 and other pass throughs are provided near the coils 108a, 108b, so that additional warm air may move into each end of the apparatus 100. Arrows in FIG. 1A show examples of movement of air into and out of apparatus—both into the sides of the apparatus 100 (which would come from computer racks in front of the apparatus 100) and the ends of the apparatus 100 (which would come from spaces between apparatus in a row), and out the top of the apparatus 100.

As shown in more detail below, such flow of warm air laterally along a row of apparatuses may provide flexibility, diversity, and redundancy to a larger system. In particular, flexibility may be provided by permitting mismatching of apparatuses 100 with cooling loads such as computer racks, e.g., cooling loads may be evenly spaced along a row, while apparatuses 100 may be unevenly spaced or may have a width that differs from that for units in the cooling loads. As a result, the apparatuses 100 may be moved laterally and spaced to meet the load.

In one example, apparatuses 100 may be spread out so as to economically cover a lowest rack power density (i.e., the apparatuses 100 would be spaced widely so as to provide only enough cooling for equipment that generates an expected minimum of heat). Then, if higher powered racks need to be cooled, the higher powered racks can be spaced apart from each other so that each rack is handled by multiple apparatuses 100 (instead of adding apparatuses 100). Blanking panels may be provided in the spaces between racks so that the apparatuses 100 in those locations do not capture ambient air from their sides, but will instead draw warm air through their ends from the space between the apparatuses 100. In an extreme case of a very high-powered rack, where all of the heat from the rack cannot be handled by lateral motion of warm air up and down a row of apparatuses 100, the rack may be moved forward away from the faces of the apparatuses 100, and a duct collar may be provided between the rear of the rack and the fronts of the multiple apparatuses 100 associated with the rack.

For diversity and redundancy, if one apparatus 100 is not operating properly, and is thus not circulating enough air or cooling the air that it is circulating sufficiently, some of that air may pass from one apparatus to another, so that the other apparatus supports an additional part of the cooling load. In this manner, additional thermal capacity may be provided to a system to decrease the size of an effect that any particular failure in the system may have on the temperature of air in a data center.

Skid channel beams 104 may be provided at or near the bottom of apparatus 100 or at another appropriate location on apparatus 100, and may be positioned so that standard pallet jacks, forklifts, or other skid machinery may conveniently engage with and lift the apparatus 100. Such an arrangement may substantially reduce the amount of time needed to install a number of apparatuses in a new data center, may permit for rearrangement of apparatuses in an existing data center, and may permit easier shipping of apparatus 100. For example, a forklift may drive from the space inside a data center to a standard loading dock, enter a tractor-trailer at the loading dock to obtain an apparatus 100 inside the truck, insert tines into skid channel beams 104, lift the apparatus 100, back the apparatus 100 out of the truck, turn around, and conveniently position the apparatus 100 as needed in a row in the data center. The length of the apparatus may be chosen to assure that pallet jacks, forklifts, and similar equipment can be used to easily load and unload the apparatus from trucks and shipping containers. A length of less than 7'-6" may allow for such universal application, and up to 8' may be accommodated by certain U.S. trailers. A width of 6' or 7' may fit well within most transport containers and still provide substantial space for maneuvering.

Fan set 120 may provide a number of fans for circulating air through the apparatus 100 so that the air may be cooled and be returned to a data center workspace. In the example, six fans in two rows of three are shown for the apparatus 100. Each fan, such as fan 122, may be operated individually by a motor controller such as fan motor controller 124. Each combination of a fan 122 and motor controller 124 may be mounted on a fan tray 126. The fan tray 126 may be a removable unit that may be slid outward from the apparatus 100, such as when a fan motor burns out or a fan controller fails, and a new fan is required to replace it. This arrangement also facilitates future capacity increases or efficiency improvements via replacement of individual fan trays. Locking mechanisms (not shown) may be provided with the fan trays 126, so that the fans seal properly when installed, and do not shake loose from the apparatus 100.

The fans may be operated to maintain a particular temperature, such as in the workspace, in the cool air plenum, or in the warm air capture plenum 109. Alternatively, the fans may be operated to maintain a particular pressure differential in the system. As one example, the fans may be operated to maintain substantially no pressure differential between a side of the housing 102, where air is received from the computer racks, and the workspace in a data center. Where such a near-zero pressure differential is maintained, any air-circulating equipment on the racks (such as fans associated with each tray in the racks) will operate as though it is working in an open room, because of the near-zero pressure difference.

Struts 128 may extend upward from apparatus 100 to support overhead equipment above apparatus 100. One such piece of equipment is cable rack 130 shown in FIGS. 1B and 1C. The cable rack 130 may be provided with cable trays to support data cabling along a length of computer racks in a data center. Such cabling may include, for example optical fiber, Cat 5 cable, and CX4 cable. Cable trays 132, 134, 136 are shown in this example to provide support for such cables. In general, as shown in FIG. 1C, the cable trays 132, 134, 136 may be arranged in-line with a longitudinal axis of the apparatus 100, so that cabling may be routed along rows of computer racks in the data center, and wire taps may be dropped downward to particular computers along each row. The cable trays may take familiar forms, such as intermittently-spaced bent wires, and the spacing between each wire may be dependent on support requirements and the expected rigidity of the cable to be placed in the particular cable tray, so that cable will not droop unnecessarily below any particular tray.

A cross support 138 may provide additional rigidity to the cable rack 130. Other supporting structures may also be provided as appropriate. Strut 129 may extend downward and may mate with strut 128 provided on apparatus 100. For example, strut 128 may be of the size and shape that is similar to an interior portion of strut 129, so that strut 129 may slide down and over strut 128. If a fixed length is acceptable, struts 128, 129 may be combined into a single continuous strut. Other similar struts may also be provided in a familiar manner to provide sufficient mounting points for cable rack 130.

The struts 128, 129 and associated racks may also support additional overhead loads. For example, such racks may support busways, receptacle strips, lighting, fire detection and suppression (e.g., sprinklers) and other components.

While the cooling coils 108a, 108b are shown for illustration in a V-formation in the figures, they may take other arrangements as well. For example, the cooling coils 108a, 108b may each be in a vertical position and may be at, or slightly behind an open face of the housing 102. In such an arrangement, the cooling coils 108a, 108b will be directly facing warmed air coming out of computer racks. The coils 108a, 108b may extend to the floor of housing 102 or a blanking panel may be provided to connect and seal the bottom area between cooling coil 108a and cooling coil 108b, so that air does not pass between the warm air capture plenum 109 and the cool air plenum without first passing through the coils 108a, 108b and being cooled. Also, as shown in more detail below in FIG. 2, the cooling coils 108a, 108b may be mounted horizontally, such as in the form of a single cooling coil 212 that faces the fans in fan set 202.

An anchor lip 118 is shown on a front face of apparatus 100 in FIGS. 1A and 1C. The anchor lip 118 may be provided at a height that is at an upper edge, lower end, or other location of the back portion of computer racks that are to be mounted to apparatus 100. The anchor lip 118 may provide one or more attachment points at which the computer racks may be connected to the apparatus 100. For example, various holes may be drilled in a surface of anchor lip 118, so that pins or other connecting mechanisms may be inserted through the holes to fixedly connect the computer racks to the apparatus 100. As a result, the apparatus 100 may provide an anchoring for the computer racks, such as in the event of an earthquake, so that the computer racks do not easily tip forward into a workspace. Other anchoring structures may also be provided as appropriate.

Apparatus 100 may be constructed of various appropriate materials. For example framing members that support apparatus 100 may be in the form of extruded aluminum channels, I-beams, box beams, rolled or press-formed sheet metal, or angle members, among other arrangements. Various forms of iron, plastics, or other materials may also be used in the structural members and in other components of apparatus 100. In addition, sheet metal may be used to form components such as blanking panel 114, and may also be used to form other, structural components, such as framing members. The components of apparatus 100 may be joined in various manners such as by use of adhesives, welding, riveting, or other joining techniques, such as by the use of pop-riveted sheet metal.

In operation, as explained in more detail below, a number of apparatuses such as apparatus 100 may be installed in a row in a substantially straight line. Each apparatus 100 may be positioned so that its end, where blanking panel 114 is shown in the figures, faces an opposed end of the next adjacent apparatus. Adjacent apparatuses may abut with each other, or may have space between their ends. Such space, during operation, may serve as part of an extended warm air capture plenum 109 for an overall system, because air may flow to and from such a space through the area previously covered by blanking panel 114 (during shipping) and through pass through 117 and into the warm air capture plenum 109 of apparatus 100.

The sides of such an open area between apparatuses in a row may be separated from a workspace by computer racks that are placed in front of the apparatuses, including between individual apparatuses. The top of such an open area may be separated from a workspace via a top blanking panel (not shown). Such a blanking panel may, for example, take the form of a flexible pleated material that can accommodate different lengths for a space. The blanking panel may also take the form of a pair of metal sheets with fasteners attached to one sheet and grooves provided in the other sheet, so that the sheets may slide in and out relative to each other and then be fixed in position by tightening a connector such as a wing nut on the fastener. Where an above-ceiling space is used as a warm-air collection zone, the area may be ducted to such a space.

When the apparatuses are in position, computer racks may then be rolled in front of the racks in a substantially linear fashion to form a row of racks. Other computer racks may be rolled into position on the opposite side of the apparatuses to form another row of racks. The combination of the row of apparatuses sandwiched between the two rows of racks may itself form a row in the data center. Multiple such rows may be installed next to each other, with aisles between each of the rows providing workspace for technicians in the data center. In this manner, a relatively high density of computers and associated computer cooling may be provided in a data center in a relatively simple and flexible manner.

Figure 2:
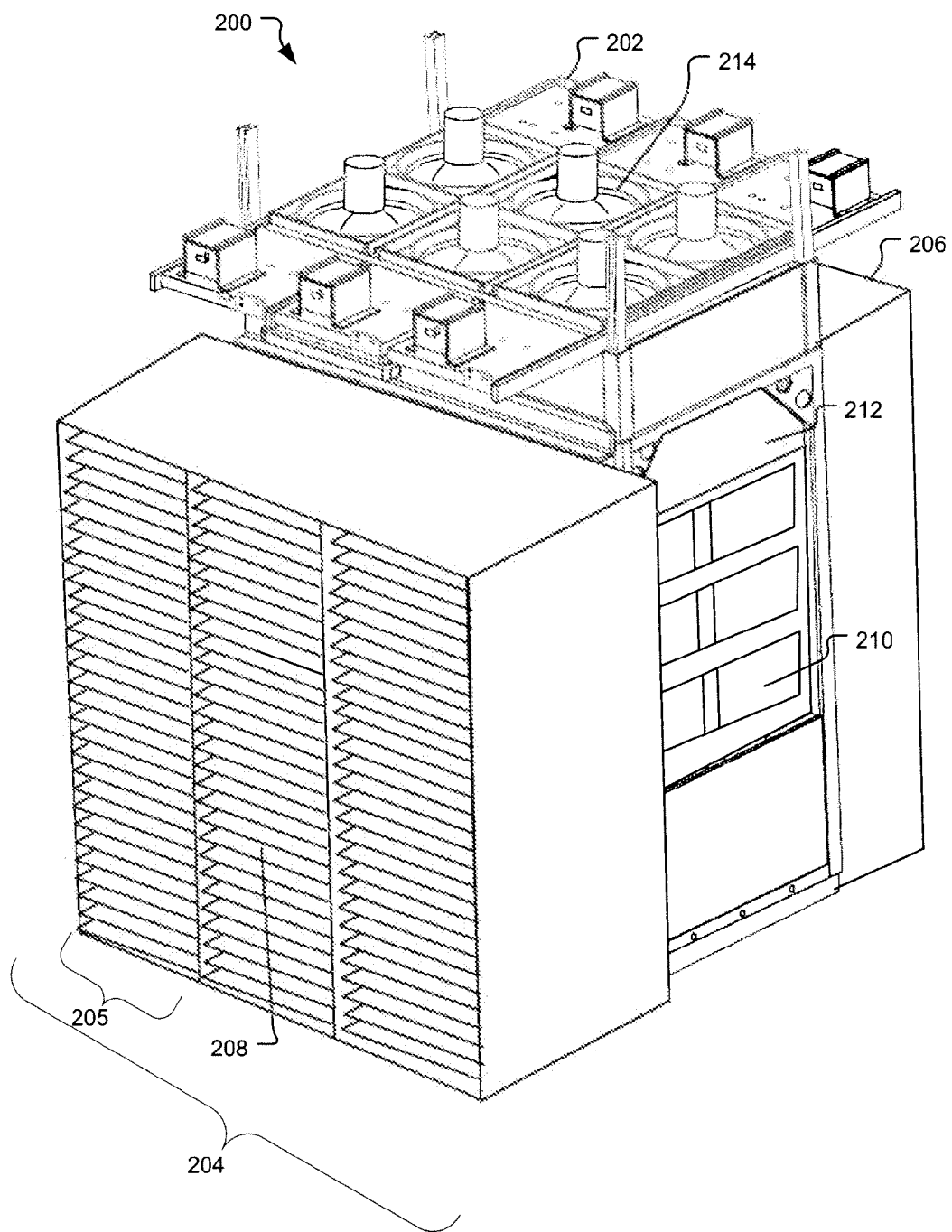
FIG. 2 shows a perspective view of a data center cooling apparatus providing cooling to a number of computer racks.

FIG. 2 shows a perspective view of a data center cooling apparatus 200 providing cooling to a number of computer racks 204, 206. In general, the apparatus 200 takes a form similar to the apparatus 100 shown in FIGS. 1A-1C. here, however, the apparatus 200 is shown in combination with computer racks 204, 206 that may be used with the apparatus 200 and cooled by the apparatus 200. The racks 204, 206 are slightly wider than is the apparatus 200, with rack 204 sticking out beyond apparatus 200 at both ends, and rack 206 sitting flush with the near end of apparatus 200 (and thus sticking father past the far end of apparatus 200 (not shown)).

Each rack 204, 206 may be made up of three separate vertical bays, such as bay 205. The bays may be each connected so that the racks 204, 206 are single units that move together on wheels (not shown). Each bay may be approximately the width and depth of a computer motherboard, and may take a form much like that of a bakery or cafeteria rack, having supporting ledges on each side of a bay over which the motherboards may be slid and dropped into place like a tray in a bread rack. As a result, each motherboard (alone or in combination with other components) is simply referenced here as a tray, such as tray 208.

The trays in the bays may connect to a number of outside services such as data cabling and electrical power, which connections have been omitted here for clarity. For example, a data jack, such as an RJ-45 jack, may be provided along a front edge of each tray 208, and cabling may be brought down from a rack, such as cable rack 130 in FIG. 1B. in addition, a power supply and air circulation fan may be provided near the front or back of each tray or group of trays, and a power cord may run from the power supply to the front of each tray and may be plugged into a vertical power strip running down the front of each bay near the edge of each bay. Other cabling arrangements may also be used where appropriate.

Other arrangements of computer racks may also be provided. For example, motherboards may be provided in a vertical arrangement, where multiple motherboards are stacked side by side. In such an arrangement, the motherboards may also connect to a backplane in a manner commonly known as a blade server arrangement. Also, motherboards may be grouped into modular units, so that multiple motherboards may be provided to, or taken from, bay 205 at one time.

Various racks having substantial front-to-rear airflow may be cooled by apparatus 200, including various industry standard racks. Racks that require rear access for maintenance and other functions may also be accommodated, such as by moving them forward from the apparatus 200. A width of two feet, for instance, may be a practical minimum for serviceability, and three feet or four feet may provide additional room. In such a situation, the warm air may mix more with ambient air before it is capture than compared to an arrangement having with more intimate coupling. If mixing is excessive, doors or curtains or other mechanisms may be used to seal off the end of the service aisle and reduce mixing.

In this example also, a single horizontal cooling coil 212 is shown, as compared to the V-shaped arrangement of FIGS. 1A-1C. The coil 212 is located directly beneath air circulation fans such as fan 214 in a fan set 202. The fans may thus draw air directly upward through the coil 212 and blow the cool air upward into the ceiling space in a data center workspace. The coil 212 may have less surface area than would a pair of coils in a V-shaped arrangement, so that the velocity of air through the coil 212 may be higher, the coil may need to be deeper, and the pressure drop through the coil may be greater. As a result, the fans 202, such as fan 214, may need to be controlled to provide a higher pressure increase than if coil 212 were larger in surface area and shallower in depth. However, such an increased pressure drop through the coil 212 may be offset by a reduced pressure drop due to the elimination of the vertical channel between V-coils.

The coil 212 may be provided with structures by which the coil 212 may be rotated, or pivoted, downward so that the coil face moves toward one of the sides of apparatus 200. In such a position, a dolly, forklift, or other similar mechanism may be brought to the face of the apparatus 200 to lift the coil 212 out of the apparatus 200. In a similar manner, a new coil may be inserted to replace coil 212.

In addition, openings such as opening 210 may be provided in opposed sides of apparatus 212 in a manners similar to that described above, so that warm air may pass freely into one apparatus from the area adjacent the apparatus, where the apparatuses are installed in rows.

In some implementations, networking gear may be provided on top of racks 204, 206, or at the end of a row of racks or apparatuses. The pass throughs or openings at the end of an apparatus that is last in a row of apparatuses may also be left open to draw air in from a workspace. Where gear such as networking gear is located near such an opening, air may be drawn past such gear to provide cooling to the gear. The networking gear may also connect to an apparatus 200 in a manner to other computer racks (e.g., so that air is drawn across a rack of networking gear and into apparatus 200).

Figure 3A:
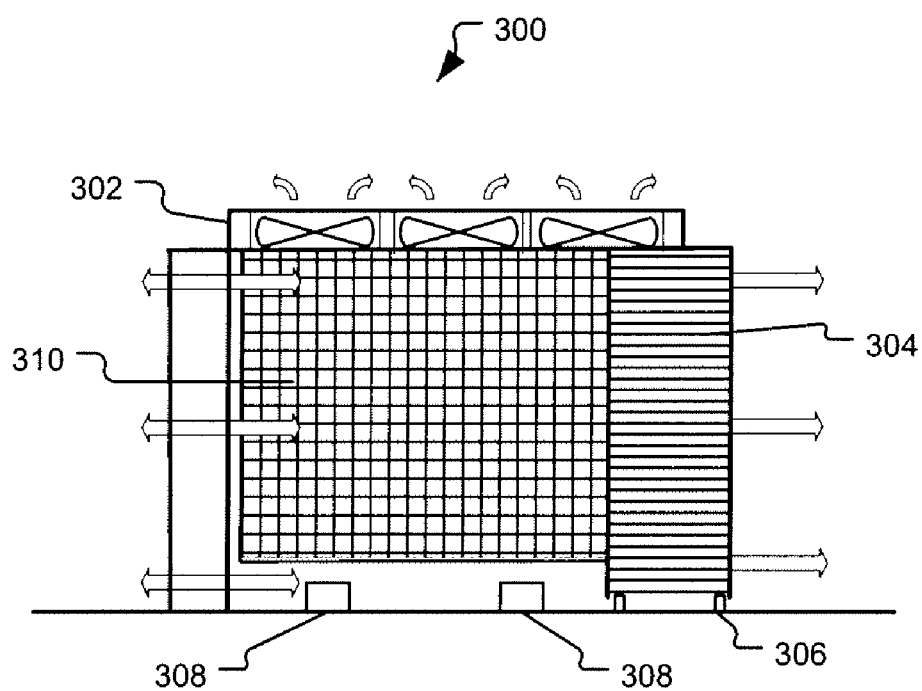
FIG. 3A shows a front view of a data center cooling apparatus with a single computer rack.
Figure 3B:
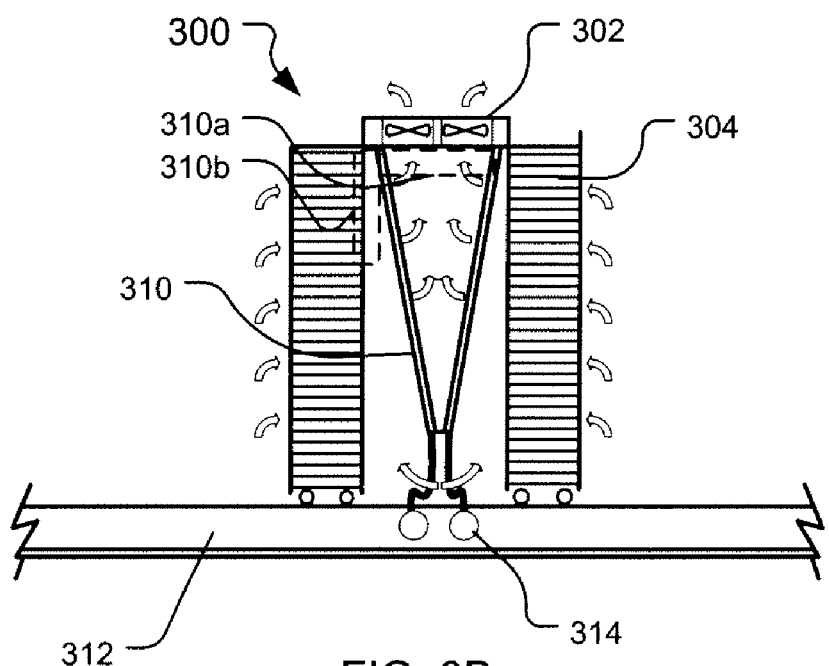
FIG. 3B shows a data center cooling apparatus with a pair of back-to-back computer racks.

FIG. 3A shows a front view of a data center cooling apparatus with a single computer rack 304. In general, this figure shows a computer rack 304 positioned in front of a modular cooling apparatus 302, to form an air circulation system 300. FIG. 3B shows a side view of the same apparatus, with another computer rack on a back side of the apparatus 302, to form a back-to-back configuration. In this example, the rack 304 is a single bay rather than a three-bay assembly as in the earlier figures. The other two bays have been left out to provide a clearer view of the apparatus 302 relative to the rack 304.

The rack 304 is provided with caster wheels 306 so that it may be easily manipulated by a technician in a data center, and positioned in front of the apparatus 302. Locking structures or other joining mechanisms may hold the rack 304 in place and may, in appropriate circumstances, seal the rack to the apparatus 302 to prevent air leaks. However, where fans in the apparatus 302 are controlled to maintain a nearly zero pressure differential between the workspace and the area at the front of the apparatus 302, there is less need for such sealing because of the lack of a pressure differential between a warm air capture plenum in the apparatus 302 and the workspace.

The face of apparatus 302, near its left side, is visible in FIG. 3A because no racks have yet been positioned there. This view shows a front surface of a coil 310, which may be a surface like one sees when looking at the front of a car radiator. In this example, the surface area may be relatively large, such as on the order of 6 feet wide by 5 feet high. The coils may be sized in an appropriate manner to provide cooling to offset the heat generated by computers in a rack 304 and in other racks corresponding to apparatus 302. Also, a space may be provided beneath the coils to prevent air to pass from one side of the apparatus 302 to the other. As shown by the flow arrows, air may also be allowed to pass in and out of ends of the apparatus 302.

In one example, apparatus 302 may support six or more bays in a pair of racks, as may be seen in FIG. 4 and the accompanying description. Each bay may, in turn, host on the order of 20 to 40 trays, which may each include one or more microprocessors and associated electronics, and a power supply. Certain of the trays may be dedicated to processing, while other trays may be dedicated wholly or in part to storage or networking, and may host a number of hard drives or other storage mechanisms, which generally generate less heat than do microprocessors.

FIG. 3A also shows lifting structures in the form of skid channels 308 under the apparatus 302. As explained above, such structures may provide for convenient transport, movement, positioning, and repositioning of the apparatus 302 by standard processes and with standard equipment. Other lifting structures such as overhead hooks may also be employed. The ends of apparatus 302 are also shown as being open, as described above and as indicated by air flow arrows pointing left and right in FIG. 3A along the length of apparatus 302, to permit for apparatus-to-apparatus flow of warm air.

As shown in FIG. 3B, a back-to-back arrangement is provided, and a V-shaped coil 310 arrangement is also provided. From this angle, a raised floor is shown as defining a sub-space 312 below the data center. The sub-space 312 may hold, for example, coolant (e.g., water or refrigerant) supply and return piping 314. Connections tapping off of such piping may extend up through the floor and into the apparatus 302.

In another arrangement, the raised floor may be eliminated, and the piping 314 may run lengthwise inside the apparatus 302. Such piping may be moved into place after a row or part of a row of such apparatuses are moved into place (e.g., by sliding it down the row and into the housings). Alternatively, each apparatus may have its own length of supply piping and a length of return piping that each terminate near an end of the apparatus housing. Piping segments for adjacent apparatuses may then be connected using short flexible connectors. Or where such apparatuses are separated by a space, the connection may be made by a length of standard piping inserted between the adjacent apparatuses (perhaps with flexible connections at each end).

FIG. 4 shows a plan view of two rows 402, 406 in a computer data center. In general, this figure illustrates certain levels of density and flexibility that may be achieved with structures like those discussed above. Each of the rows 402, 406 is made up of a row of cooling modules 412 sandwiched by two rows of computing racks 411, 413. A row may also be provided with a single row of computer racks, such as by pushing the cooling modules up against a wall of a data center, providing blanking panels all across one side of a cooling module row, or by providing cooling modules that only have openings on one side.

This figure also shows a component—network device 410—that was not shown in prior figures. Network device 410 may be, for example, a network switch into which each of the trays in a rack plugs, and which then in turn communicates with a central network system. For example, the network device may have 20 or data more ports operating at 100 Mbps or 1000 Mbps, and may have an uplink port operating at 1000 Mbps or 10 Gbps, or another appropriate network speed. The network device 410 may be mounted, for example, on top of the rack, and may slide into place under the outwardly extending portions of a fan tray such as fan tray 126 in FIG. 1A. Other ancillary equipment for supporting the computer racks may also be provided in the same or a similar location, or may be provided on one of the trays in the rack itself.

Each of the rows of computer racks and rows of cooling units in each of rows 402, 406 may have a certain unit density. In particular, a certain number of such computing or cooling units may repeat over a certain length of a row such as over 100 feet. Or, expressed in the converse, each of the units repeats once every X feet of row.

In this example, each of the rows is approximately 40 feet long. Each of the three-bay racks is approximately six feet long. And each of the cooling units is slightly longer than each of the racks. Thus, for example, if each rack were exactly six feet long and all of the racks were adjoining, the rack units would repeat every six feet. As a result, the racks would be said to have a six-foot "pitch."

As can be seen, the pitch for the cooling module rows is different in row 402 than in row 406. Row 412 in row 402 contains five cooling modules, while the corresponding row of cooling modules in row 406 contains six cooling modules. Thus, if one assumes that the total length of each row is 42 feet, then the pitch of cooling modules in row 406 would be 7 feet (42/6) and the pitch of cooling modules in row 402 would be 8.4 feet (42/5).

The pitch of the cooling modules and of the computer racks may differ (and the respective lengths of the two kinds of apparatuses may differ) because warm air is able to flow up and down rows such as row 402. Thus, for example, a bay or rack may exhaust warm air in an area in which there is no cooling module to receive it. But that warm air may be drawn laterally down the row and into an adjacent module, where it is cooled and circulated back into the work space, such as aisle 404.

With all other things being equal, row 402 would receive less cooling than would row 406. However, it is possible that row 402 needs less cooling, so that the particular number of cooling modules in each row has been calculated to match the expected cooling requirements. For example, row 402 may be outfitted with trays holding new, low-power microprocessors, row 402 may contain more storage trays (which are generally lower power than processor trays) and fewer processor trays, or row 402 may generally be assigned less computationally intensive work than is row 406.

In addition, the two rows 402, 406 may both have had an equal number of cooling modules at one time, but then an operator of the data center may have determined that row 402 did not need as many modules to operate effectively. As a result, the operator may have removed one of the modules so that it could be used elsewhere.

The particular density of cooling modules that is required may be computed by first computing the heat output of computer racks on both sides of an entire row. The amount of cooling provided by one cooling module may be known, and may be divided into the total computed computer heat and rounded up to get the number of required cooling units. Those units may then be spaced along a row so as to be as equally spaced as practical, or to match the location of the heat load as closely as practical, such as where certain computer racks in the row generate more heat than do others. Also, as explained in more detail below the row of cooling units may be aligned with rows of support columns in a facility, and the units may be spaced along the row so as to avoid hitting any columns.

Where there is space between cooling modules, a blanking panel 420 may be used to block the space so that air from the warm air capture plenum does not escape upward into the work space. The panel 420 may simply take the form of a paired set of sheet metal sheets that slide relative to each other along slots 418 in one of the sheets, and can be fixed in location by tightening a connector onto the slots.

FIG. 4 also shows a rack 424 being removed for maintenance or replacement. The rack 424 may be mounted on caster wheels so that one of technicians 422 could pull it forward into aisle 404 and then roll it away. In the figure, a blanking panel 416 has been placed over an opening left by the removal of rack 424 to prevent air from the work space from being pulled into the warm air capture plenum, or to prevent warm air from the plenum from mixing into the work space. The plenum may be a solid panel, a flexible sheet, or may take any other appropriate form.

In one implementation, a space may be laid out with cooling units mounted side-to-side for maximum density, but half of the units may be omitted upon installation (e.g., so that there is 50% coverage). Such an arrangement may adequately match the cooling unit capacity (e.g., about four racks per unit, where the racks are approximately the same length as the cooling units and mount back-to-back on the cooling units) to the heat load of the racks. Where higher powered racks are used, the cooling units may be moved closer to each other to adapt for the higher heat load (e.g., if rack spacing is limited by maximum cable lengths), or the racks may be spaced from each other sufficiently so that the cooling units do not need to be moved. In this way, flexibility may be achieved by altering the rack pitch or by altering the cooling unit pitch.

Figure 5B:
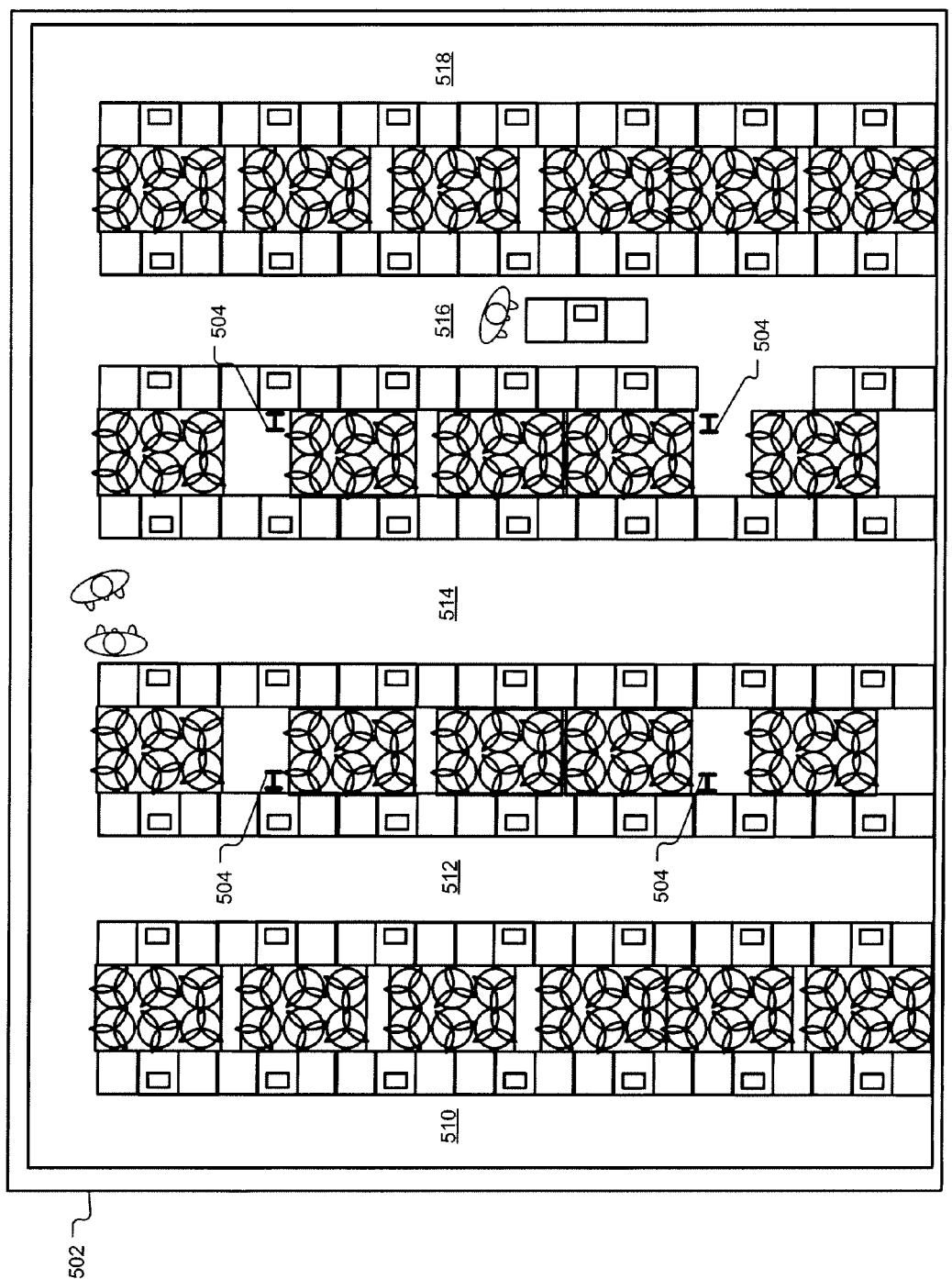
FIG. 5B shows the facility of FIG. 5A with computers and cooling systems installed.

FIG. 5A shows a plan of an empty computer data center facility, while FIG. 5B shows the facility of FIG. 5A with computers and cooling systems installed. These figures generally illustrate a data center layout and construction technique that may take advantage of the flexibility in being able to move cooling modules and/or computer racks longitudinally along a data center row.

In FIG. 5A, the focus is on the facility 502, which has a length and a width such that four columns are required in the facility 502 to hold up the roof. (The number in a real data center would likely be much larger, but the small number here is used for illustration.) The facility 502 may be an existing facility into which data center equipment is to be installed, or may be a facility about to be built, where the column spacing is affected by factors other than data center layout (so that the designer has to live with the spacings he or she has). For example, common, readily-available steel sizes, and known construction techniques, may dictate column spacings of a certain dimension, such as every 20 feet, every 30 feet, or every 40 feet. The particular columns 504, may have a plurality of spacings in the X dimension (506*a-c*) and a plurality of spacings in the Y dimension (508*a-c*). The spacings in a particular dimension may be equal or unequal to each other, and the spacing of each of the dimensions in the grid may be equal (a square grid) or unequal (in whole or in part).

In FIG. 5B, data center equipment has been placed in rows and located in the facility 502 to fit efficiently with the given support column layout of the facility 502. The particular figure may show a planned layout for a facility or an actual layout. In the figure, rows have first been spaced so as to fit on the support columns 504 shown in FIG. 5A, and then all possible numbers of rows have been positioned so as to fit between the rows that include support columns. Here, the columns were very close (less than 20 feet apart) so there was little room for extra rows. As a result of locating the rows on the columns, rather than picking a set width for each item, certain aisles in the data center workspace may be wider than are others. For example, aisle 514 appears to be wider than any of the other aisles 510, 512, 516, and 518. To maximize the widths of those smaller aisles however, the column-hiding aisles have been pushed as far inward toward aisle 514 as possible, given the particular example arrangement of the illustrated system (though the columns could be placed in the part of the row where the computer racks are; however, such an arrangement would displace useful computing resources simply to accommodate the columns).

Cooling modules in the rows having support columns are also unevenly spaced. In particular, to position such modules, the space between columns 508*b* may be known, and the length of a cooling module may be divided into it, with the result rounded down, to determine the number of modules that can fit between adjacent support columns.

Because of the particular dimension of the components in FIG. 5B, the column-hiding aisles can fit one less cooling module compared to the other aisles, and also have more "dead" space than the other aisles. Such a reduction in cooling modules may have no effect, if the computers that exhaust air into those rows are not generating more heat than even the reduced number of modules can absorb. If the heat is too high for the reduced number of modules, however, then the air being provided into the work space from those rows may be slightly elevated in temperature as compared to that coming from other rows. However, if such an event occurs, that slightly warmer air will quickly blend with the other air in the workspace, dissipating the temperature increase over a wide area. By this process, the techniques described here may provided an additional level of redundancy in the event of partial or complete failure of an individual coil or cooling module. In addition, the large area in the workspace helps serve as a shock absorber to prevent such disturbances from having an appreciable effect on the operation of any computer rack in the facility 502.

FIG. 6 shows a schematic side view of an example data center facility. This figure again shows a row of computer racks 606 front on a row of cooling modules 609. And again, the pitches of the two components have been chosen to differ—though they are spaced to match up at the ends of each row Though not shown, another level of racks may also be provided in the space above the level that is shown. Such a multi-level arrangement may increase the computer density available for a building having a particular footprint, and may be achieved, for example, by building a full two-story structure with fully reinforced floors and the like. Alternatively, a catwalk may be provided above the main floor, and the catwalk or other structures may support the weight of the racks and the cooling modules. For example, the components may be mounted on elevated rails that run lengthwise with the rows of computer racks and cooling modules (e.g., left to right in FIG. 6). The rails may thus support rows of computer racks and cooling units immediately above rows of racks and cooling units on the main level—essentially creating a second floor in a facility that has a high ceiling, using rails and catwalks. A lateral rail system may be provided at one end of the facility 600 (e.g., the left end in FIG. 6) to move components back-and-forth between longitudinal rails, and a lift system may also be provided to manipulate components down to the main floor where they can be handled with equipment such as fork lifts.

The facility 600 is also shown as having a number of support columns 607 rising vertically through the facility space. As can be seen in the figure, the cooling modules have been spaced along the rows to fit within the available space between the columns, and the columns have disappeared into the warm air capture plenum between those cooling modules.

In the figure, the data center includes a raised floor that defines an under-floor area 610. The under-floor area may be used to support piping such as coolant supply piping 612 and coolant return piping 614. Cooling water or another coolant may circulate in and out through the piping 612, 614 to serve cooling coils in the cooling modules.

The pictured system cools the returned water that is to be supplied back to the facility via cooling plant 604. Cooling plant 604 may include various components needed to provide cooled water or other fluids to the computer racks in the facility 600. In some implementations, the cooling plant may be made up of modular units, such as a base unit that contains many of the pumps and heat exchanging equipment for providing cooling water, such as in a rectangular steel frame that is capable of being shipped on a standard train bed or truck bed. The cooling plant 604 may also include a number of cooling towers 622 that can be lifted into position on top of the base unit once the base unit is installed. Again, such modular design may permit the cooling plant 604 to be built and tested off-site and trucked to a site, so as to increase quality and decrease delays and costs.

The cooling plant may generally include a heat exchanger 626 for removing heat from the cooling water and passing it to cooling tower water, and cooling towers 622, to pass the accumulated heat to the ambient air through evaporation and cooling of the cooling tower water. In general operation, the cooling plant 604 may provide sufficient cooling from the cooling tower/heat exchanger/cooling coil system, though a powered refrigeration system such as a chiller 620 may be provided for peak loads, such as when the outdoor ambient dew point is very high and the cooling tower cannot provide sufficient cooling alone. Control parameters for the system may also be set so as to avoid most or any need for the use of chillers or other such items.

The temperatures of each portion of the system 600 are selected to be relatively high, so as to permit more efficient operation of the system 600, than if the temperatures were lower. For example, relatively high air temperatures in the system (e.g., air entering a cooling coil over 110° F. and exiting temperature above 70° F. or above 77° F. may in turn permit for relatively high cooling water temperatures (e.g., water entering a cooling coil around 68° F. and exiting around 104° F. because the amount of heat that can be taken out of the air is generally proportional to the difference in temperature between the water and the air. If the difference between air and coolant temperatures can be kept at an acceptable level, where the coolant temperatures are high enough that evaporative cooling (e.g., cooling through a cooling tower, without further cooling via chiller) is sufficient to provide cooling to the system 600, the relatively high electrical infrastructure and operating costs of a chiller (or many chillers) may be avoided.

Cooling water may be provided from a cooling water circuit powered by pump 616. The cooling water circuit may be formed as a direct-return, or indirect-return, circuit, and may generally be a closed-loop system. Pump 616 may take any appropriate form, such as a standard centrifugal pump. Heat exchanger 626 may remove heat from the cooling water in the circuit. Heat exchanger 626 may itself take any appropriate form, such as a plate-and-frame heat exchanger or a shell-and-tube heat exchanger.

Heat may be passed from the cooling water circuit to a condenser water circuit, or cooling tower water circuit, that includes heat exchanger 626, pump 624, and cooling towers 622. Pump 624 may also take any appropriate form, such as a centrifugal pump. Cooling towers 622 may be, for example, one or more forced draft towers, induced draft towers, or hybrid cooling towers. The cooling towers 622 may be considered free cooling sources, because they require power only for movement of the water in the system and in some implementations the powering of a fan to cause evaporation; they do not require operation of a compressor in a chiller or similar structure.

As shown, the fluid circuits may create an indirect water-side economizer arrangement. This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 626, and routing cooling tower water (condenser water) directly to cooling modules 609.

Such an implementation may be more efficient, as it removes one heat exchanging step. However, such an implementation also causes water from the cooling towers 622 to be introduced into what would otherwise be a closed system. As a result, the system in such an implementation may be filled with water that may contain bacteria, algae, and atmospheric contaminants, and may also be filled with other contaminants in the water. Such an implementation may require extensive water filtration and chemical conditioning. A hybrid tower, as discussed above, may provide similar benefits without the same detriments.

Various control valves may control and mix water in the cooling plant 604 in various convention manners. A control valve is provided in the condenser water circuit to supply make-up water to the circuit. Make-up water may generally be needed because the cooling towers 622 operate by evaporating large amounts of water from the circuit. The control valve may be tied to a water level sensor in the cooling tower 622 basins.

Optionally, a separate chiller circuit that uses a chiller 620 may be provided. Operation of cooling plant 604 may switch partially or entirely to this circuit during times of extreme atmospheric ambient (i.e., hot and humid) conditions or times of high heat load in the facility 600. Controlled mixing valves 628 are provided for electronically switching to the chiller circuit, or for blending cooling from the chiller circuit with cooling from the condenser circuit. Pump 624 may supply tower water to chiller 620, and the heat exchanger 626 or supply water only to the heat exchanger 626 when the chiller 620 is not in service. Chiller 620 may take any appropriate form, such as a centrifugal, reciprocating, or screw chiller, or an absorption chiller.

Pumps 616 and 624 may be provided with variable speed drives. Such drives may be electronically controlled by a central control system to change the amount of water pumped by each pump in response to changing set points or changing conditions in the system.

In operation, cooling plant 604 may respond to signals from various sensors placed in the facility 600. The sensors may include, for example, thermostats, humidistats, flowmeters, and other similar sensors. In one implementation, one or more thermostats may be provided in warm air capture plenums in the cooling modules 609, and one or more thermostats may be placed in workspace 608. In addition, air pressure sensors may be located in workspace 608, and in the warm air capture plenums. The thermostats may be used to control the speed of associated pumps, so that if temperature begins to rise, the pumps turn faster to provide additional cooling water. Pressure sensors may be used to control the fans to maintain a constant pressure in the warm air capture plenum. Where mechanisms for increasing cooling, such as speeding the operation of pumps, are no longer capable of keeping up with increasing loads, a control system may activate chiller 620 and associated pumps and may modulate control valves 628 accordingly to provide additional cooling.

In some implementations, multiple cooling plants may be provided for a facility 600. The plants may be aligned along one exterior wall of the facility 600, and may be at an end of rows in the datacenter. For instance, each cooling plant 600 may be associated with, and positioned at the end of, a set number of rows inside the facility, such as a single row or two rows. The particular plant may then serve that row or rows. Additional diversity and redundancy may also be provided by connecting each of the cooling plants to a common header and each of the rows to a common header, so that every row can still access cooling water from the header even if one of the plants goes off line (though perhaps the cooling water temperature will be greater than a setpoint then).

Figure 7:
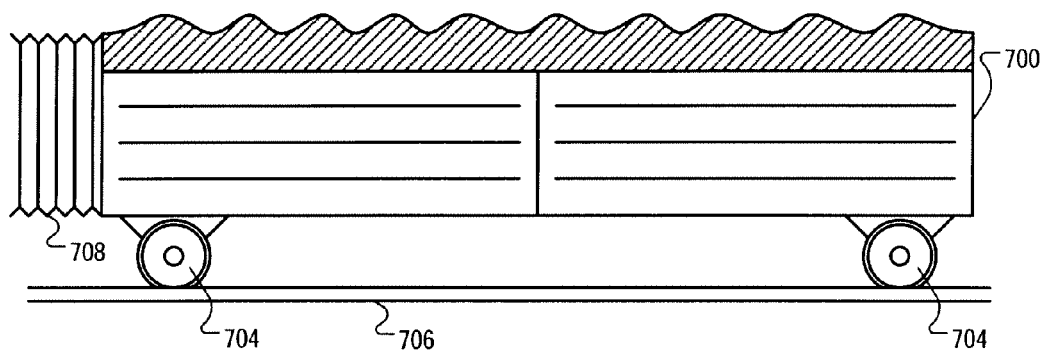
FIG. 7 shows an alternative base for a cooling module.

FIG. 7 shows an alternative base for a cooling module 700. The module 700 may be similar to the module 100 shown in FIG. 1A, 2, or 3. However, in this implementation, the module 700 is provided with wheels 704 that may be aimed along a row of modules and may be spaced to interface with rails 706, like railroad rails, installed in a facility. In addition, a pleated bellows 708 may be provided between modules so stretch and compress as the modules are moved relative to each other on the rails 706. The bellows 708 are shown here on a front edge of the module end, though they may be provided only on top and bottom edges if computer racks need to back up to the space between modules and provide warm air to the space between the modules. A similar bellows may be use to connect the cold air plenums of adjacent cooling modules, to reduce the negative effects of failures of fans or groups of fans.

The wheels 704 may provide for easier manipulation and adjustment of cooling units in a facility. In particular, cooling units may be moved up and down a row to match particular cooling requirements and to better match cooling capacity to heating load.

Figure 8:
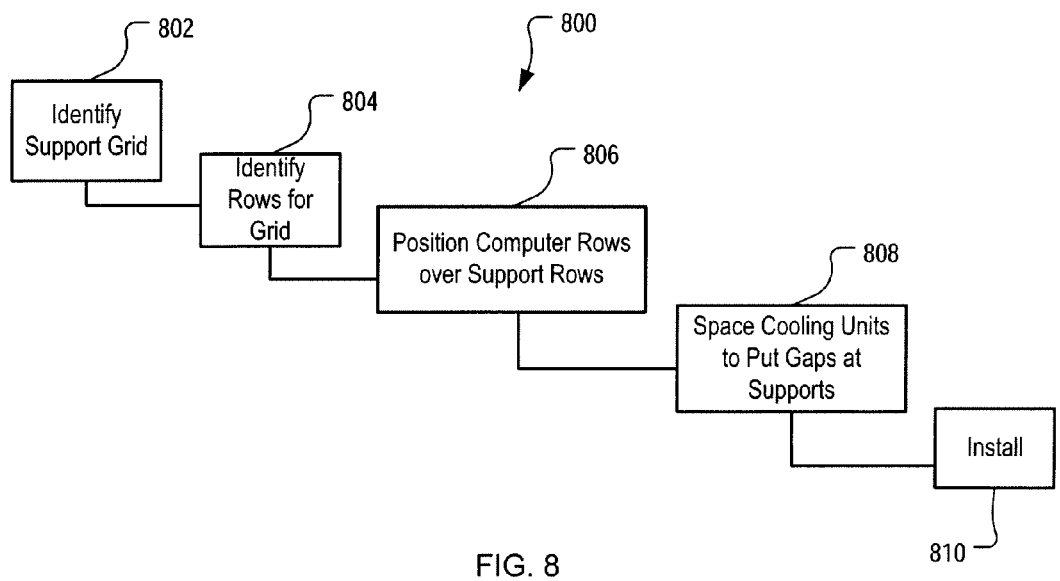
FIG. 8 is a flow chart of a process for locating rows in a data center so as to hide structural columns in the data center.

FIG. 8 is a flow chart of a process 800 for locating rows in a data center so as to hide structural columns in the data center. At box 802, a grid of structural columns is identified. Such identification might involve locating the columns in an actual building or on a plan, and measuring the locations of, and spacing between, the columns.

At box 804, rows in the structural grid are identified. Such an identification may involve identifying a direction for the rows in the computer racks, i.e., whether the racks are going to run North-South or East-West. Such a direction may have been previously set, or may be determined according to a direction that will permit the highest density of computing components or according to other factors. The rows in the structural grid are then the aligned building columns running in the direction of the rows of racks.

At box 806, the computer rows are positioned laterally and spaced from each other so that the computer rows (and, in particular, the cooling module row that is part of the computer row) lie on top of the structural columns. When there is sufficient space between the column-enveloping rows, addition rows may be added in the space for greater component density; generally, such space may require space for a pair of rows racks, a row of cooling units, and aisles on each side of the racks. With the rows positioned, then the lengthwise positioning of the cooling modules within the structural column-enveloping rows may be set. For example, the space between two columns may be measured, and the length of a typical module may be divided into that space and rounded downward (box 808). With the remaining extra space between columns, the modules may then be spread out. Where the actions just described are performed for a design rather than an actual installation, the process may then proceed to installing the components according to the design (box 810).

A number of embodiments have been described. Nevertheless, it will be understood that various modifications may be made. For example, various forms of the flows shown above may be used, with steps re-ordered, added, or removed. Also, although several applications of the cooling systems and methods have been described, it should be recognized that numerous other applications are contemplated. Moreover, although many of the embodiments have been described in relation to particular geometric arrangements of cooling and ventilation units, and electronics racks, various other arrangements may also be used. Accordingly, other embodiments are within the scope of the following claims.

What is claimed is:

1. A datacenter cooling apparatus, comprising:
   a portable housing having lifting and transporting structures for moving the apparatus,
   opposed sides in the housing, at least one of the opposed sides defining one or more air passage openings arranged to capture warmed air from rack-mounted electronics;
   opposed ends in the housing, at least one of the opposed ends defining one or more air passage openings positioned to allow lateral passage of captured air into and out of the housing; and
   one or more cooling coils associated with the housing to receive and cool the captured warm air, and provide the cooled air for circulation into a datacenter workspace,
   wherein the opposed sides each define one or more openings to engage with back-to-back computer racks.

2. The apparatus of claim 1, further comprising computer racks on opposed sides of the apparatus, and positioned to provide warm air to the apparatus.

3. The apparatus of claim 2, further comprising a space inside the housing between the opposed faces in the warm-air plenum whereby warm air may pass from one of the one computer rack to an opposed computer rack.

4. The apparatus of claim 1, further comprising skid mounts on the housing to permit movement of the apparatus using a mechanical lift.

5. The apparatus of claim 1, wherein the housing defines a width along the ends and a length along the sides that is greater than the width, and wherein the length is between about six feet and about eight feet.

6. The apparatus of claim 1, further comprising one or more fans mounted on the apparatus and positioned to circulate air from the electronics through the cooling coils and into the datacenter workspace.

7. The apparatus of claim 6, wherein the one or more fans are located near a top edge of the housing and are positioned to blow air vertically upward.

8. The apparatus of claim 7, wherein the one or more cooling coils are mounted horizontally below the fans.

9. The apparatus of claim 8, wherein the one or more cooling coils are rotatable into a vertical orientation for servicing.

10. The apparatus of claim 6, wherein the one or more fans are located on replaceable mounts with associated fan motor controllers.

11. The apparatus of claim 1, wherein the one or more cooling coils are arranged in a V formation and form a cool-air plenum that is separate from the warm air capture plenum.

12. The apparatus of claim 1, further comprising a wiring rack supported by the housing for holding networking cable in a position to be interfaced with the rack-mounted computers.

13. The apparatus of claim 1, further comprising anchors on the housing having attachment points for computer racks to provide seismic support for the racks.

14. The apparatus of claim 1, further comprising a barrier near a periphery of the housing, the barrier having sealed openings for permitting passage of cooling water piping to the cooling coils.

15. The apparatus of claim 14, wherein the openings are in a floor of the apparatus and define an opening longitudinal axis that forms a substantial angle with an apparatus longitudinal access so as to permit positioning of piping along a diagonal of the apparatus.

16. The apparatus of claim 1, further comprising rollers located near a bottom portion of the apparatus configured to engage tracks for permitting lateral movement of the apparatus.

17. A data center cooling system comprising a plurality of apparatuses as recited in claim 3, wherein the apparatuses are positioned in one or more end-to-end substantially linear arrangements, and computer racks are located on opposed sides of the apparatuses.

18. The system of claim 17, wherein the plurality of apparatuses define an apparatus pitch and the computer racks define one or more rack pitches, and wherein the apparatus pitch differs substantially from the rack pitches.

19. The system of claim 17, wherein two or more of the plurality of apparatuses are separated by an end-to-end distance.

20. A data center cooling system, comprising:
   a plurality of cooling modules aligned end-to-end in one or more rows;
   sides on the cooling modules defining openings for capturing warm air from electronics racks mounted to the cooling modules; and
   ends on the cooling modules defining openings for passing air into and out of the cooling modules along a row of cooling modules,
   wherein the cooling modules in a row are positioned to have open spaces between adjacent cooling modules and wherein the spaces are sufficiently sealed from a data center workspace to form a warm air capture zone.

21. The system of claim 20, further comprising one or more cooling coils in each cooling module positioned between the warm air capture zone and a circulation fan suction zone.

22. The system of claim 21, wherein the cooling coil comprise a pair of opposed coils in a V formation.

23. The system of claim 21, further comprising one or more fans associated with each cooling module for drawing warm air through the cooling coils.

24. The system of claim 20, further comprising electronic equipment racks in rows on opposed sides of the cooling unit rows to provide warm air to the cooling units.

25. The system of claim 24, wherein the cooling units define a cooling unit pitch and the electronic equipment racks define one or more rack pitches, and wherein the cooling unit pitch differs substantially from the rack pitches.

26. The system of claim 20, wherein the warm air capture plenum is contiguous along an entire row of the data center.

27. The system of claim 20, wherein the cooling units in one or more rows are unevenly spaced along the one or more rows.

28. The system of claim 20, further comprising wiring racks supported by the cooling units for holding networking cable in a position to be interfaced with electronic equipment cooled by the system.

29. The system of claim 20, further comprising a plurality of support structures extending upward from a data center floor and forming a plurality of rows of support structures,
   wherein each of the rows of cooling units envelops a row of support structures so that the support structures are out of a working area of the data center.

30. The system of claim 29, wherein the cooling units comprise air cooling and circulation units having one or more air circulation fans and one or more cooling coils.

31. The system of claim 29, wherein the cooling units define spaces between adjacent cooling units, and the support structures are located in the defined spaces.

32. The system of claim 29, further comprising a plurality of computer server racks defining substantially linear rows on opposed sides of each of the rows of cooling units.

33. A modular data center cooling apparatus, comprising:
- a housing sized for over-the-road transport and having four sides, and a top surface and bottom surface, and defining an interior volume;
- one or more cooling coils arranged within the interior volume so as to thermally separate portions of the interior volume, so as to create a cool air plenum on one side of the coils and one or more warmed air plenums on opposed sides of the coils; and
- one or more fans positioned to circulate air through the cooling coils;
- wherein at least three of the sides and the top surface or bottom surface are open, so that substantial airflow may pass through the open sides or surfaces;
- wherein the open sides each define one or more openings to engage with computer racks that back up to the sides, so that the apparatus can circulate air through the computer racks.

34. The apparatus of claim 33, further comprising an open space inside the housing that connects a first side having an opening to engage with a computer rack, to a second side having an opening to engage with a computer rack.

35. The apparatus of claim 33, wherein the one or more fans are positions to circulate air from the computer racks through the cooling coils and into a data center workspace around the apparatus.

36. The apparatus of claim 35, wherein the one or more fans are located at or near the top surface of the housing and are positioned to blow air vertically upward.

37. The apparatus of claim 36, wherein the one or more cooling coils are mounted horizontally below the fans.

38. The apparatus of claim 33, wherein the one or more cooling coils are arranged in a V formation between the cool air plenum and the one or more warm air plenums.

39. The apparatus of claim 34, further comprising a barrier near a periphery of the housing, the barrier having sealed openings for permitting passage of cooling water piping to the cooling coils.

40. A data center cooling system comprising:
- a plurality of apparatuses positioned in one or more end-to-end substantially linear arrangements, each apparatus comprising:
  - a housing sized for over-the-road transport and having four sides, and a top surface and bottom surface, and defining an interior volume, at least two of the sides and the top surface or bottom surface are open, so that substantial airflow may pass through the open sides or surfaces, the open sides each define one or more openings to engage with computer racks that back up to the sides, so that the apparatus can circulate air through the computer racks;
  - one or more cooling coils arranged within the interior volume so as to thermally separate portions of the interior volume, so as to create a cool air plenum on one side of the coils and one or more warmed air plenums on opposed sides of the coils; and
  - one or more fans positioned to circulate air through the cooling coils; and
- one or more computer racks located adjacent the open sides.

41. The system of claim 40, wherein the plurality of apparatuses define an apparatus pitch and the computer racks define one or more rack pitches, and wherein the apparatus pitch differs substantially from the rack pitches.

42. The system of claim 41, wherein two or more of the plurality of apparatuses are separated by an end-to-end distance.

43. A data center cooling system, comprising:
- a frame comprising four side openings, a top opening, and a bottom opening defining an interior volume;
- at least one cooling coil mounted within the interior volume and securable to the frame, the cooling coil thermally separating the interior volume into a cold air plenum adjacent a first face of the cooling coil and a warm air plenum adjacent a second face of the cooling coil opposite the first face;
- at least one sealing member mounted on the frame to substantially prevent airflow between the bottom opening and the top opening; and
- one or more fans mounted to the frame and arranged to generate airflow through one or more computer racks supporting electronics adjacent at least two of the side openings and through the at least two side openings to the top opening.

44. The system of claim 43, wherein the frame is configured to receive at least two of the one or more computer racks directly adjacent the at least two side openings.

45. The system of claim 43, wherein the one or more fans mounted to the frame are arranged to generate airflow through the four side openings and to the top opening.

46. The system of claim 43, further comprising skid mounts on the frame to permit movement of the system using a mechanical lift.

47. The system of claim 43, wherein the frame defines a width along two of the four side openings, and a length along the other two of the four side openings that is greater than the width, and
- wherein the length is between about six feet and about eight feet.

48. The system of claim 43, wherein the fans circulate air warmed by the electronics through the at least two side openings and into the warm air plenum.

49. The system of claim 43, wherein the one or more fans are located near a top edge of the frame and are positioned to expel air vertically upward away from the frame.

50. The system of claim 43, wherein the at least one cooling coil is mounted horizontally below the one or more fans.

51. The system of claim 43, wherein the at least one cooling coil is rotatable into a vertical orientation for servicing.

52. The system of claim 43, wherein the one or more fans are located on replaceable mounts with associated fan motor controllers.

53. The system of claim 43, wherein the at least one cooling coil comprises two cooling coils are arranged in a V formation, and
- wherein the cool air plenum is located in the middle of the V formation, and the warm air plenum comprises two warm air plenums located on the outside of the V formation.

54. The system of claim 43, further comprising a wiring rack supported by the frame for holding networking cable in a position to be interfaced with the electronics.

55. The system of claim 43, further comprising anchors on the frame having attachment points for the computer racks to provide seismic support for the racks.

56. The system of claim 43, further comprising rollers located near the bottom opening of the frame and configured to engage tracks for permitting lateral movement of the system.

57. The system of claim 43, wherein the frame comprises a first frame, the system further comprising a second frame comprising four side openings, a top opening, and a bottom opening defining an interior volume, and the second frame abuts the first frame at corresponding side openings of the first and second frames.

58. The system of claim 57, wherein the first and second frames are separated by an end-to-end distance.

59. The apparatus of claim 33, wherein the housing is sized for over-the-road transport in a fully assembled state.

60. The system of claim 43, wherein the frame is sized for transport by truck from a manufacturing facility to a data center.

* * * * *